(12) United States Patent
Towns et al.

(10) Patent No.: US 8,124,965 B2
(45) Date of Patent: Feb. 28, 2012

(54) OPTO-ELECTRICAL DEVICES AND METHODS OF MAKING THE SAME

(75) Inventors: Carl Towns, Essex (GB); Caroline Towns, legal representative, Newmarket (GB); Ilaria Grizzi, Cambridge (GB)

(73) Assignees: CDT Oxford Limited, Cambridgeshire (GB); Sumitomo Chemical Co., Ltd., Tokyo (JP)

( * ) Notice: Subject to any disclaimer, the term of this patent is extended or adjusted under 35 U.S.C. 154(b) by 0 days.

(21) Appl. No.: 12/444,102

(22) PCT Filed: Oct. 9, 2007

(86) PCT No.: PCT/GB2007/003832
§ 371 (c)(1),
(2), (4) Date: Nov. 13, 2009

(87) PCT Pub. No.: WO2008/044003
PCT Pub. Date: Apr. 17, 2008

(65) Prior Publication Data
US 2010/0133566 A1 Jun. 3, 2010

(30) Foreign Application Priority Data
Oct. 10, 2006 (GB) .................................. 0620045.5

(51) Int. Cl.
*H01L 29/08* (2006.01)
(52) U.S. Cl. ............... 257/40; 257/98; 257/E51.018
(58) Field of Classification Search .............. 257/40, 257/98, E51.018
See application file for complete search history.

(56) References Cited

U.S. PATENT DOCUMENTS

| 4,539,507 | A | 9/1985 | VanSlyke et al. |
| 5,150,006 | A | 9/1992 | Van Slyke et al. |
| 5,432,014 | A | 7/1995 | Sano et al. |
| 5,621,131 | A | 4/1997 | Kreuder et al. |
| 5,723,873 | A | 3/1998 | Yang |
| 5,798,170 | A | 8/1998 | Zhang et al. |
| 6,083,634 | A | 7/2000 | Shi |
| 6,268,695 | B1 | 7/2001 | Affinito |
| 6,344,286 | B1 | 2/2002 | Kim et al. ............... 428/690 |

(Continued)

FOREIGN PATENT DOCUMENTS

EP 0707020 4/1996

(Continued)

OTHER PUBLICATIONS

International Preliminary Report on Patentability for PCT/GB2007/003832, dated Apr. 15, 2009.

(Continued)

*Primary Examiner* — Tan N Tran
(74) *Attorney, Agent, or Firm* — Marshall, Gerstein & Borun LLP

(57) ABSTRACT

An opto-electrical device comprising: a first electrode for injecting charge carriers of a first polarity; a second electrode for injecting charge carriers of a second polarity; and a layer of organic material disposed between the first and second electrodes, the layer of organic material comprising a blend of a first charge transporting and/or light-emissive polymer and a second charge transporting and/or light-emissive polymer, wherein at least the first polymer is cross-linked providing a first cross-linked matrix in which the second polymer is disposed.

21 Claims, 1 Drawing Sheet

U.S. PATENT DOCUMENTS

| | | | |
|---|---|---|---|
| 6,353,083 B1 | 3/2002 | Inbasekaran et al. | |
| 6,953,628 B2 | 10/2005 | Kamatani et al. | |
| 7,125,998 B2 | 10/2006 | Stossel et al. | |
| 7,238,435 B2 | 7/2007 | Kamatani et al. | |
| 7,250,226 B2 | 7/2007 | Tokito et al. | |
| 7,452,613 B2 * | 11/2008 | Poplavskyy et al. | 428/690 |
| 2002/0117662 A1 | 8/2002 | Nii | |
| 2002/0182441 A1 | 12/2002 | Lamansky et al. | |
| 2004/0147555 A1 | 7/2004 | Fujimoto et al. | |
| 2005/0106417 A1 | 5/2005 | Casasanta, III et al. | 428/690 |
| 2006/0177694 A1 | 8/2006 | Kamatani et al. | |

FOREIGN PATENT DOCUMENTS

| | | |
|---|---|---|
| EP | 0842208 | 5/1998 |
| EP | 0880303 | 11/1998 |
| EP | 0949850 A1 | 10/1999 |
| EP | 0947123 B1 | 2/2002 |
| EP | 1245659 | 10/2002 |
| EP | 0901176 A2 | 10/2003 |
| GB | 2348316 | 9/2000 |
| GB | 2395356 | 5/2004 |
| GB | 2421353 | 6/2006 |
| JP | 2002324679 | 11/2002 |
| WO | WO-9013148 | 11/1990 |
| WO | WO-9810621 | 3/1998 |
| WO | WO-9857381 | 12/1998 |
| WO | WO-9948160 | 9/1999 |
| WO | WO-0048258 | 8/2000 |
| WO | WO-0053656 | 9/2000 |
| WO | WO-0055927 | 9/2000 |
| WO | WO-0119142 | 3/2001 |
| WO | WO-0162869 | 8/2001 |
| WO | WO-0181649 | 11/2001 |
| WO | WO-0231896 | 4/2002 |
| WO | WO-0244189 | 6/2002 |
| WO | WO-0245466 | 6/2002 |
| WO | WO-02066552 | 8/2002 |
| WO | WO-02068435 | 9/2002 |
| WO | WO-02081448 | 10/2002 |
| WO | WO-02084759 | 10/2002 |
| WO | WO-03018653 | 3/2003 |
| WO | WO-03022908 | 3/2003 |
| WO | WO-2005049689 | 6/2005 |
| WO | WO-2006043087 | 4/2006 |
| WO | WO-2006072022 | 7/2006 |

OTHER PUBLICATIONS

Combined Search and Examination Report for GB0620045.5, dated Feb. 15, 2007.
Casasanta et al., "Polymer Blend LEDs Using Polyfluorene Copolymers and Thermally Cross-Linked Fluoropolymers," *Proceedings of SPIE*, 5351:217-225 (2004).
Siddhanta et al., "Conducting Polymer Gel: Formation of a Novel Semi-IPN from Polyaniline and Crosslinked Poly(2-Acrylamido-2Methyl Propanesulphonicacid)" *Polymer*, 46:2993-3000 (2005).
Bernius et al., "Progress with Light-Emitting Polymers," *Adv. Mater.*, 12:1737-1750 (2000).
Bozano et al., "Electroluminescent devices based on cross-linked polymer blends," *J. Appl. Phys.*, 94:3061-3068 (2003).
Chen et al., "Recent Developments in Molecular Organic Electroluminescent Materials," *Macromol. Symp.*, 125:1-48 (1997).
Chen et al., "Triplet exciton confinement in phosphorescent polymer light-emitting diodes," *Applied Physics Letters*, 82:1006-1008 (2003).
Cleave et al., "Harvesting Singlet and Triplet Energy in Polymer LEDs," *Adv. Matter*, 11:285-288 (1999).
Lane et al., "Origin of electrophosphorescence from a doped polymer light emitting diode," *Physical Review*, 63:1-8 (2001).
Lee et al., "Polymer phosphorescent light-emitting devices doped with tris(2-phenylpyridine) iridium as a triplet emitter," *Applied Physics Letters*, 77:2280-2282 (2000).
Niu et al., "Thermal annealing below the glass transition temperature: A general way to increase performance of light-emitting diodes based on copoyfluorenes," *Applied Physics Letters*, 81:634-636 (2002).
O'Brien et al., "Electrophosphorescence from a doped polymer light emitting diode," *Synthetic Metals*, 116:379-383 (2001).
Setayesh et al., "Bridging the Gap between Polyfluorene and Ladder-Poly-p-phenylene: Synthesis and Characterization of Poly-2,8-indenofluorene," *Macromolecules*, 33:2016-2020 (2000).
Yamaguchi et al., "Effects of B and C on the Ordering of $L1_0$-CoPt thin films," *Applied Physics Letters*, 79:2001-2003 (2001).
Yamamoto, "Electrically Conducting and Thermally Stable π—Conjugated Poly (arylene)s Prepared by Organometallic Processes," *Prog. Polym. Sci.*, 17:1153-1205 (1992).
Yang, "Efficient blue polymer light-emitting diodes from a series of soluble poly(paraphenylene)s," *J. Appl. Phys.*, 79:934-939 (1996).
Zhu et al., "Synthesis of new iridium complexes and their electrophosphorescent properties in polymer light-emitting diodes," *J. Mater. Chem.*, 13:50-55 (2003).
International Search Report for PCT/GB2007/003832 dated Jan. 24, 2008.

* cited by examiner

OPTO-ELECTRICAL DEVICES AND METHODS OF MAKING THE SAME

FIELD OF INVENTION

The present invention relates to opto-electrical devices and methods of making the same.

BACKGROUND OF THE INVENTION

One class of opto-electrical devices is that using an organic material for light emission or detection. The basic structure of these devices is a light emissive organic layer, for instance a film of a poly (p-phenylenevinylene) ("PPV") or polyfluorene, sandwiched between a cathode for injecting negative charge carriers (electrons) and an anode for injecting positive charge carriers (holes) into the organic layer. The electrons and holes combine in the organic layer generating photons. In WO90/13148 the organic light-emissive material is a polymer. In U.S. Pat. No. 4,539,507 the organic light-emissive material is of the class known as small molecule materials, such as (8-hydroxyquinoline) aluminium ("Alq3"). In a practical device one of the electrodes is transparent, to allow the photons to escape the device.

A typical organic light-emissive device ("OLED") is fabricated on a glass or plastic substrate coated with a transparent anode such as indium-tin-oxide ("ITO"). A layer of a thin film of at least one electroluminescent organic material covers the first electrode. Finally, a cathode covers the layer of electroluminescent organic material. The cathode is typically a metal or alloy and may comprise a single layer, such as aluminium, or a plurality of layers such as calcium and aluminium.

In operation, holes are injected into the device through the anode and electrons are injected into the device through the cathode. The holes and electrons combine in the organic electroluminescent layer to form an exciton which then undergoes radiative decay to give light.

These devices have great potential for displays. However, there are several significant problems. One is to make the device efficient, particularly as measured by its external power efficiency and its external quantum efficiency. Another is to optimise (e.g. to reduce) the voltage at which peak efficiency is obtained. Another is to stabilise the voltage characteristics of the device over time. Another is to increase the lifetime of the device.

To this end, numerous modifications have been made to the basic device structure described above in order to solve one or more of these problems. Further layers may be provided between the electrodes and the organic light-emissive layer in order to aid charge injection and transport. It is particular preferred to use a hole injecting layer and/or a hole transporting layer between the anode and the light-emissive layer. The hole injecting layer may comprise a conductive polymer such as PEDOT:PSS. The hole transport layer may comprise a semiconductive polymer such as a copolymer of fluorene and triarylamine repeat units. The organic light-emissive layer may comprise a small molecule, a dendrimer or a polymer and may comprise phosphorescent moieties and/or fluorescent moieties.

The applicant's earlier published application, WO99/48160, discloses a light-emissive layer comprising a blend of materials including light emissive moieties, electron transport moieties and hole transport moieties. These may be provided in a single molecule or on separate molecules.

The use of a blend of materials in a single layer rather than providing separate layers of charge transporting and emissive material has the advantage that the materials can be deposited in a single pass, simplifying the manufacturing process for a device. Furthermore, the provision of a single layer having multiple functionalities may in principle result in better charge transport, charge transfer and emissive properties. Devices can also be made thinner due to a reduction in the number of layers which may reduce the voltage required to drive the device. Furthermore, a reduction in the number of interfaces between layers in a devices can be advantageous as interfaces can provide a source of structural defects in the device and may also be a source of detrimental electrical and optical effects such as impedance of charge flow through the device, light scattering and internal reflections.

While the use of blends in an opto-electrical device was proposed to have several advantages over the provision of multiple layers of material, it has been found that there are several problems with the use of blends in opto-electrical devices. It can be difficult to control the structure and properties of a blend. For example, the inter-mixing of materials in a blend can be difficult to control and may be unstable due to movement of chemical species within the blend, particularly when a device is driven. Provision of the different species in a single molecule can help to prevent differential movement of the species during driving of the device. However, multiple component polymers can be more difficult to make. Furthermore, even if the species are provided in the same molecule, partial phase separation of the species may still occur if the molecules change alignment during driving such that the species partially phase separate with like portions of the polymers forming domains within a layer. Such a change in the structure of a blend can result in a change in the functional properties of the blend during the lifetime of the device. As it is an aim to stabilise the voltage characteristics of an opto-electrical device over time, such an effect may be detrimental.

In light of the problems with using blends of material, many researchers in this field have looked at reverting back to the multi-layered device structure in which charge transporting and light-emissive components are provided in separate layers and considered how this arrangement could be improved.

In this regard, the applicant's earlier published application, WO 2006/043087, discloses cross-linking of polymers in opto-electrical devices in order to allow multiple layers to be deposited on top of each other without inter-mixing. This document discloses cross-linkable, hole transporting monomers which may be polymerised, deposited, and then cross-linked to form a hole transport layer on which an emissive layer can be deposited without dissolving the hole transport layer. It is also disclosed that the cross-linkable, hole transporting monomers can be mixed with light-emissive monomers, polymerised to form a polymer which has both the hole transporting monomers and the light-emissive monomers therein, deposited, and then cross-linked to form a light emissive layer on which an electron transporting layer can be deposited without dissolving the light-emissive layer.

The aforementioned arrangement gives a very robust device structure and allows multiple layers to be deposited without inter-mixing. However, it does not fully utilize the benefits of blending materials having different functionalities as discussed above in relation to WO99/48160.

WO 2005/049689 discloses cross-linkable fluorene compounds for use in electroluminescent devices.

Bozano et al, J. Appl. Phys. 2003, 94(5), 3061-3068 discloses cross-linked two-component blends for organic light-emitting devices.

As such, the present inventors have realized that it would be desirable to provide an arrangement in which the beneficial features of using a blend are present, but where the detrimental features are avoided.

SUMMARY OF THE INVENTION

According to a first aspect of the present invention there is provided an opto-electrical device comprising: a first electrode for injecting charge carriers of a first polarity; a second electrode for injecting charge carriers of a second polarity; and a layer of organic material disposed between the first and second electrodes, the layer of organic material comprising a blend of a first charge transporting and/or light-emissive polymer and a second charge transporting and/or light-emissive polymer, wherein at least the first polymer is cross-linked providing a first cross-linked matrix in which the second polymer is disposed.

The first and second polymers are different.

In accordance with an embodiment of the present invention, stable morphology can be achieved by using a functional group to cross-link between polymers in an organic film, i.e. to achieve a single cross-linked matrix comprising two or more polymers in a blend. However this can be a rather crude method and the chemistry used is very often indiscriminate resulting in ill-defined structures. The indiscriminate nature of the chemistry could also mean that one has little control over the process.

In light of the above, it is advantageous to selectively cross-link one or both of the polymers. According to one embodiment, if only one of the polymers is cross-linked, the other being, for example, a simple linear non-functionalised polymer, which is disposed through the cross-linked matrix as a continuous phase as opposed to a phase separated aggregate, a semi-interpenetrating network is formed. There is little or no cross-linking between the two polymers.

Alternatively, the other of the charge transporting polymer and the light-emissive polymer is also cross-linked providing a second cross-linked matrix which is disposed through the first cross-linked matrix as a continuous phase, whereby the first cross-linked matrix and the second cross-linked matrix provide an interpenetrating network. Again, there is little or no cross-linking between the two polymers.

Both interpenetrating and semi-interpenetrating network structures result in an intimate mixture of polymer chains with stable amorphous morphology. Interpenetrating networks or semi interpenetrating networks provide organic layers having a stable morphology within opto-electrical devices, even when driven over long time periods.

Interpenetrating networks offer an elegant means of "locking-in" morphology creating stable thin films with clearly defined structures. They also offer the advantage of being capable of providing blends whilst still being able to provide a stable morphology.

While the use of a cross-linked hole transport layer with a separate light emissive layer as disclosed in, for example, WO 2006/043087, provides a stable interface, embodiments of the present invention can provide a stable graded interface. The concentration of the first and second polymers may vary across the layer of organic material. For example, the layer of organic material may comprise a first region of the first polymer, a second region of the second polymer, and an interface region disposed between the first and second regions, the interface region comprising the blend.

Additionally, the arrangement disclosed in WO 2006/043087 involves the separate deposition of two layers; a hole transport layer and a light-emissive layer, in order to provide a stable system. In contrast, in accordance with embodiments of the present invention, a blend of two cross-linkable systems, or one cross-linkable and one non-cross-linkable system, provides a stable blend morphology whilst depositing organic material only once.

The first polymer may be hole transporting polymer. The second polymer may be a light-emissive polymer and/or an electron transporting polymer. In one arrangement, the second polymer is an electron transporting polymer and comprises a light-emissive moiety, e.g., a phosphorescent moiety, disposed therein. The light-emissive moiety may be provided as a separate component or chemically bound to the electron transporting polymer.

Alternatively, the first and second polymers may both be charge transporting polymers—i.e. they may both be hole transporting polymers; they may both be electron transporting polymers; or one may be a hole transporting polymer and the other may be an electron transporting polymer. For example, in the case where the first and second polymers are hole transporting polymers, an emissive layer may be provided over the crosslinked layer comprising the first and second polymers. The two different first and second hole transporting polymers may provide "stepped" hole transport from the anode (or hole injection layer, if present) into the emissive layer. The two different hole transporting polymers may differ in type, arrangement and/or quantity of hole transporting unit in the polymer. In particular, the two different polymer may possess different HOMO levels so as to provide stepped hole transport.

Alternatively, the first and second polymers may be light-emissive polymers capable of emitting different wavelengths of light which combine to provide a white emissive device. In this regard, the layer of organic material may further comprise a third polymer which is capable of emitting light of a different wavelength to that of the first and second polymers which combines with the light emitted by the first and second polymers to provide the white emissive device. White emission preferably falls within the region defined by a CIE x coordinate equivalent to that emitted by a black body at 2500-9000K and CIE y coordinate within 0.05 of the CIE y co-ordinate of said light emitted by a black body. More preferably, the region defined by a CIE x coordinate equivalent to that emitted by a black body at 4000-8000K and CIE y coordinate within 0.025 of the CIE y co-ordinate of said light emitted by a black body.

A layer of charge injecting material, such as hole injecting material, may be disposed between the layer of organic material and the first electrode to aid charge injection into the layer of organic material. The charge injecting material may comprise a conductive polymer such as doped PEDOT, preferably PEDOT:PSS.

The first and second polymers are preferably semi-conductive conjugated polymers.

According to one embodiment of the present invention, the difference in wavelength between an emission maximum of the first polymer and an absorption maximum of the second polymer is greater than 30 nm.

According to another embodiment of the present invention, the first polymer is a light-emissive polymer and the second polymer is a charge transporting polymer, wherein the light-emissive polymer accepts charge carriers of a first polarity from the charge transporting polymer and charge carriers of a second polarity from either the first or the second electrode.

According to another aspect of the present invention there is provided a method of manufacturing an opto-electrical device, the method comprising: depositing, over a substrate comprising a first electrode for injecting charge carriers of a first polarity, a mixture of a first and a second polymer in a solvent; cross-linking the first polymer to form a first cross-linked matrix in which the second polymer is disposed; and depositing a second electrode for injecting charge carriers of a second polarity.

The method may further comprise cross-linking the second polymer to form a second cross-linked matrix, whereby the first cross-linked matrix and the second cross-linked matrix form an interpenetrating network. Alternatively, if only one of the polymers is cross-linked, the other being, for example, a simple linear non-functionalised polymer, a semi-interpenetrating network is formed.

In one arrangement, the first polymer is cross-linked by heating to a first temperature and the second polymer is cross-linked by heating to a second temperature which is higher than the first temperature.

The first and second polymers may partially phase separate after deposition and prior to cross-linking. Thus, for example, separate regions of charge transporting and light-emissive polymer material may be formed with a graded interface comprising an interpenetrating or semi-interpenetrating network therebetween.

According to another aspect of the present invention there is provided a method of manufacturing an opto-electrical device, the method comprising: depositing, over a substrate comprising a first electrode for injecting charge carriers of a first polarity, a first polymer in a first solvent; depositing, over the first polymer material, a second polymer in a second solvent; waiting a period of time to allow the first and second polymer materials to inter-mix at least partially; cross-linking the first and/or the second polymers to form an interpenetrating or semi-interpenetrating network; and depositing a second electrode for injecting charge carriers of a second polarity.

According to another aspect of the present invention there is provided an opto-electrical device comprising: a first electrode for injecting charge carriers of a first polarity; a second electrode for injecting charge carriers of a second polarity; a layer of organic material disposed between the first and second electrodes, the layer of organic material comprising a blend of a first charge transporting and/or light-emissive polymer and a second charge transporting and/or light emissive polymer, at least the first polymer being cross-linked to provide a first cross-linked matrix in which the second polymer is disposed; and an emissive layer formed over the layer of organic material.

According to another aspect of the present invention there is provided a method of manufacturing an opto-electrical device, the method comprising the steps of:
depositing, over a substrate comprising a first electrode for injecting charge carriers of a first polarity, a first charge transporting and/or light-emissive polymer;
partially crosslinking said first polymer depositing a charge transporting and/or light-emissive material over said partially crosslinked first polymer;
further crosslinking said first polymer; and
depositing a second electrode for injecting charge carriers of a second polarity.

The partially crosslinked first polymer provides a surface that is stable against dissolution, and yet provides a laterally porous structure into which the charge transporting and/or light-emissive material is at least partially absorbed before being "locked in" by the further crosslinking step.

The skilled person will be aware of suitable conditions for achieving partial crosslinking of the first polymer. For example, in the case of a thermally crosslinked polymer, the time and/or temperature of thermal treatment may be selected to provide a partially crosslinked polymer.

According to another aspect of the present invention there is provided an opto-electrical device comprising: a first electrode for injecting charge carriers of a first polarity; a second electrode for injecting charge carriers of a second polarity; and a layer of organic material disposed between the first and second electrodes, the layer of organic material comprising a blend of a first charge transporting material and a second charge transporting material, wherein at least one of the first and second charge transporting materials comprises a crosslinked polymer.

Preferably, the opto-electrical device is an organic light-emitting device comprising an organic light emitting layer. Preferably, the first and second charge transporting materials are hole transporting materials. The organic light-emitting layer may be deposited from solution onto the layer of organic material comprising the first and second charge transporting materials.

In addition to the advantages of the crosslinked layers described above, these layers possess the further advantage of being insoluble. Thus, the polymers may be deposited from solution and subsequently cross-linked to form a layer that is stable to subsequent deposition of materials from solution. This has the benefit that multiple active layers may be deposited from solution.

Preferably, the first electrode according to any of the aforementioned aspects of the invention is an anode and the second electrode is a cathode.

The crosslinkable polymers described above may be deposited directly onto the first electrode. However, in the case where the first electrode is the anode, it is preferable that a layer of hole injection material is provided between the anode and the crosslinkable polymer.

BRIEF DESCRIPTION OF THE DRAWINGS

Embodiments of the present invention will now be described by way of example only with reference to the accompanying drawing in which.

DETAILED DESCRIPTION OF EMBODIMENTS OF THE INVENTION

General Device Architecture

Figure 1:
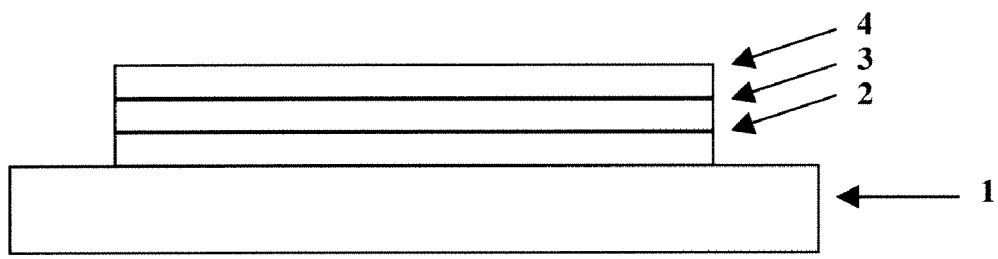
FIG. 1 shows an organic light-emissive device according to an embodiment of the present invention.

With reference to FIG. 1, the architecture of an electroluminescent device according to an embodiment of the invention comprises a transparent glass or plastic substrate 1, an anode 2 of indium tin oxide and a cathode 4. An light-emissive layer 3 is provided between anode 2 and cathode 4.

Charge Transport Layers

Further layers may be located between anode 2 and cathode 3, such as charge transporting, charge injecting or charge blocking layers.

In particular, it may be desirable to provide a conductive hole injection layer formed of a doped organic material located between the anode 2 and the light-emissive layer 3 to assist hole injection from the anode into the layer or layers of semiconducting polymer. Examples of doped organic hole injection materials include doped poly(ethylene dioxythiophene) (PEDOT), in particular PEDOT doped with polystyrene sulfonate (PSS) as disclosed in EP 0901176 and EP 0947123, or polyaniline as disclosed in U.S. Pat. No. 5,723,873 and U.S. Pat. No. 5,798,170. Hole injection layers comprising inorganic materials may also be employed, for example transition metal oxides such as molybdenum oxide.

One or more semi-conductive hole transporting layers may be provided located between anode 2 and light-emissive layer 3. If present, preferably, the hole transport layer has a HOMO level of less than or equal to 5.5 eV, more preferably around 4.8-5.5 eV. The hole transporting layer may be provided in conjunction with the above-identified hole injecting layer and located between the hole injecting layer and the electroluminescent layer 3. Multiple hole transporting layers may provide stepped hole transport from the anode (or hole injection layer, if present) to the light-emissive layer 3.

If present, an electron transporting layer may be located between light-emissive layer 3 and cathode 4 preferably has a LUMO level of around 3-3.5 eV.

Light-Emissive Layer

Light-emissive layer 3 comprises a light-emissive polymer blended with a charge transporting polymer, at least one of the charge transporting polymer and the light-emissive polymer being cross-linked to provide a first cross-linked matrix in which the other of the charge transporting polymer and the light-emissive polymer is disposed. A further light-emissive layer may be deposited over light-emissive layer 3 to provide a device wherein emission from the device arises from both light-emissive layer 3 and the further light-emissive layer, for example in order to produce white light.

In another embodiment (not illustrated), a hole transporting layer comprising two hole transporting polymers is provided between the anode and the light-emissive layer, at least one of the hole transporting polymers being cross-linked to provide a cross-linked matrix in which the other hole transporting polymer is disposed. If only one of the hole transporting polymers is cross-linked then the surface of the hole transporting layer may be permeable, and the light-emissive layer may at least partially be absorbed into the hole transporting layer, thus providing a graded interface between the hole transporting layer and the emissive layer.

In another embodiment (not illustrated), a light-emissive layer comprising two light emissive polymers is provided between the anode and the light-emissive layer, at least one of the light-emissive polymers being cross-linked to provide a cross-linked matrix in which the other light-emissive polymer is disposed. An electron transporting material may be deposited over the cross-linked emissive layer. If one of the light-emissive polymers is not cross-linked then the electron transport layer may at least partially be absorbed into the emissive layer.

Conjugated Polymers (Fluorescent and/or Charge Transporting)

Suitable light-emissive polymers for use in layer 3 include poly(arylene vinylenes) such as poly(p-phenylene vinylenes) and polyarylenes such as: polyfluorenes, particularly 2,7-linked 9,9 dialkyl polyfluorenes or 2,7-linked 9,9 diaryl polyfluorenes; polyspirofluorenes, particularly 2,7-linked poly-9,9-spirofluorene; polyindenofluorenes, particularly 2,7-linked polyindenofluorenes; polyphenylenes, particularly alkyl or alkoxy substituted poly-1,4-phenylene. Such polymers as disclosed in, for example, Adv. Mater. 2000 12(23) 1737-1750 and references therein.

Polymers may comprise a first repeat unit selected from arylene repeat units, in particular: 1,4-phenylene repeat units as disclosed in J. Appl. Phys. 1996, 79, 934; fluorene repeat units as disclosed in EP 0842208; indenofluorene repeat units as disclosed in, for example, Macromolecules 2000, 33(6), 2016-2020; and spirofluorene repeat units as disclosed in, for example EP 0707020. Each of these repeat units is optionally substituted. Examples of substituents include solubilising groups such as $C_{1-20}$ alkyl or alkoxy; electron withdrawing groups such as fluorine, nitro or cyano; and substituents for increasing glass transition temperature (Tg) of the polymer.

Particularly preferred polymers comprise optionally substituted, 2,7-linked fluorenes, most preferably repeat units of formula:

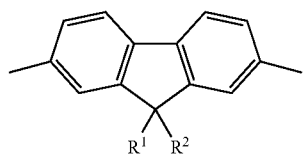

wherein $R^1$ and $R^2$ are independently selected from hydrogen or optionally substituted alkyl, alkoxy, aryl, arylalkyl, heteroaryl and heteroarylalkyl. More preferably, at least one of $R^1$ and $R^2$ comprises an optionally substituted $C_4$-$C_{20}$ alkyl or aryl group.

A polymer comprising the first repeat unit may provide one or more of the functions of hole transport, electron transport and emission depending on which layer of the device it is used in and the nature of co-repeat units.

In particular:

a homopolymer of the first repeat unit, such as a homopolymer of 9,9-dialkylfluoren-2,7-diyl, may be utilised to provide electron transport.

a copolymer comprising a first repeat unit and a triarylamine repeat unit, in particular a repeat unit selected from formulae 1-6, may be utilised to provide hole transport and/or emission:

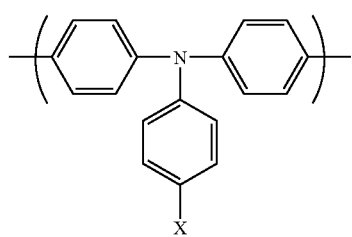

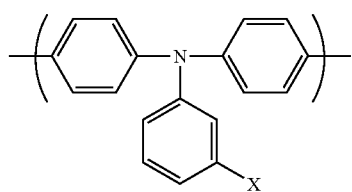

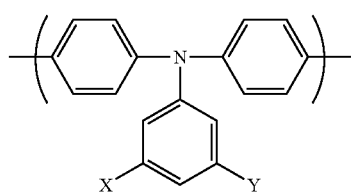

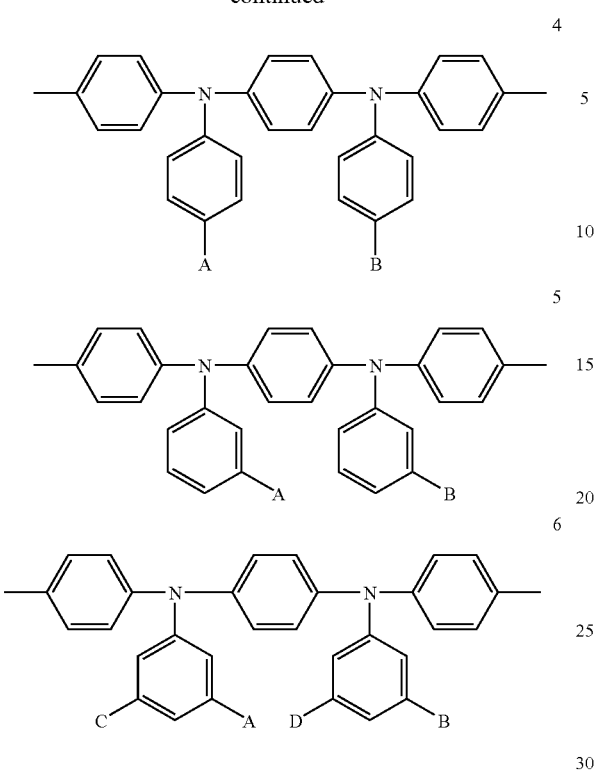

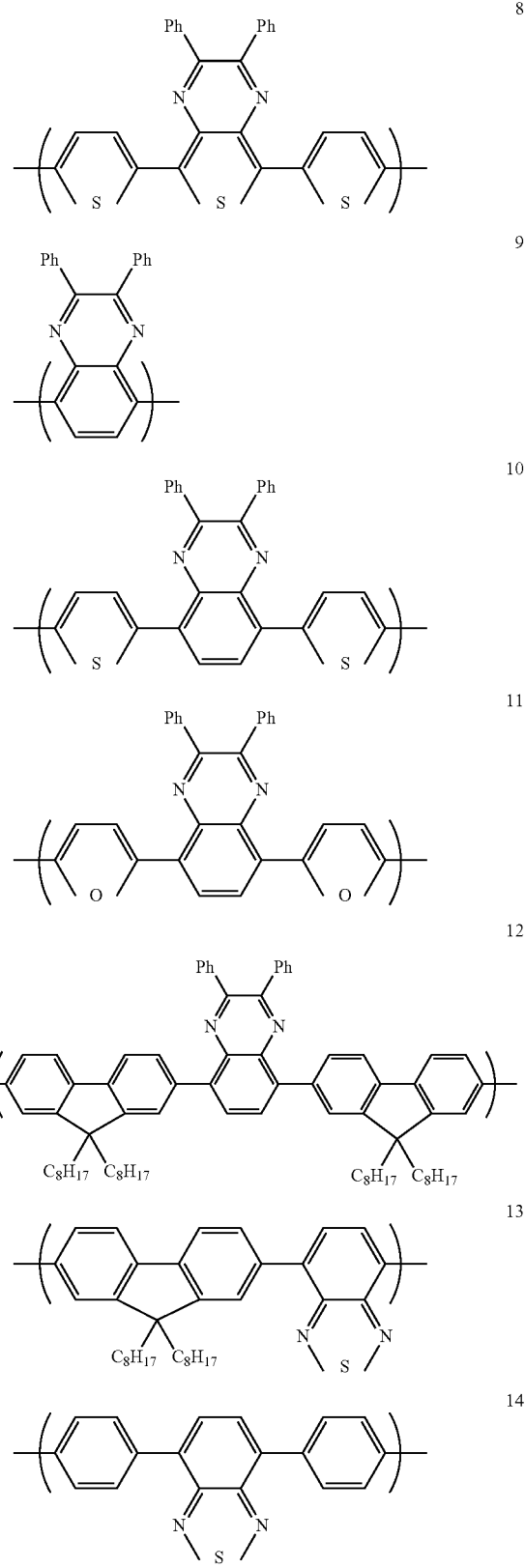

wherein X, Y, A, B, C and D are independently selected from H or a substituent group. More preferably, one or more of X, Y, A, B, C and D is independently selected from the group consisting of optionally substituted, branched or linear alkyl, aryl, perfluoroalkyl, thioalkyl, cyano, alkoxy, heteroaryl, alkylaryl and arylalkyl groups. Most preferably, X, Y, A and B are $C_{1-10}$ alkyl.

Particularly preferred hole transporting polymers of this type are AB copolymers of the first repeat unit and a triarylamine repeat unit.

a copolymer comprising a first repeat unit and heteroarylene repeat unit may be utilised for charge transport or emission. Preferred heteroarylene repeat units are selected from formulae 7-21:

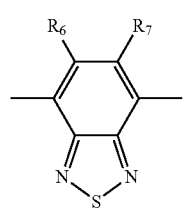

wherein $R_6$ and $R_7$ are the same or different and are each independently hydrogen or a substituent group, preferably alkyl, aryl, perfluoroalkyl, thioalkyl, cyano, alkoxy, heteroaryl, alkylaryl or arylalkyl. For ease of manufacture, $R_6$ and $R_7$ are preferably the same. More preferably, they are the same and are each a phenyl group.

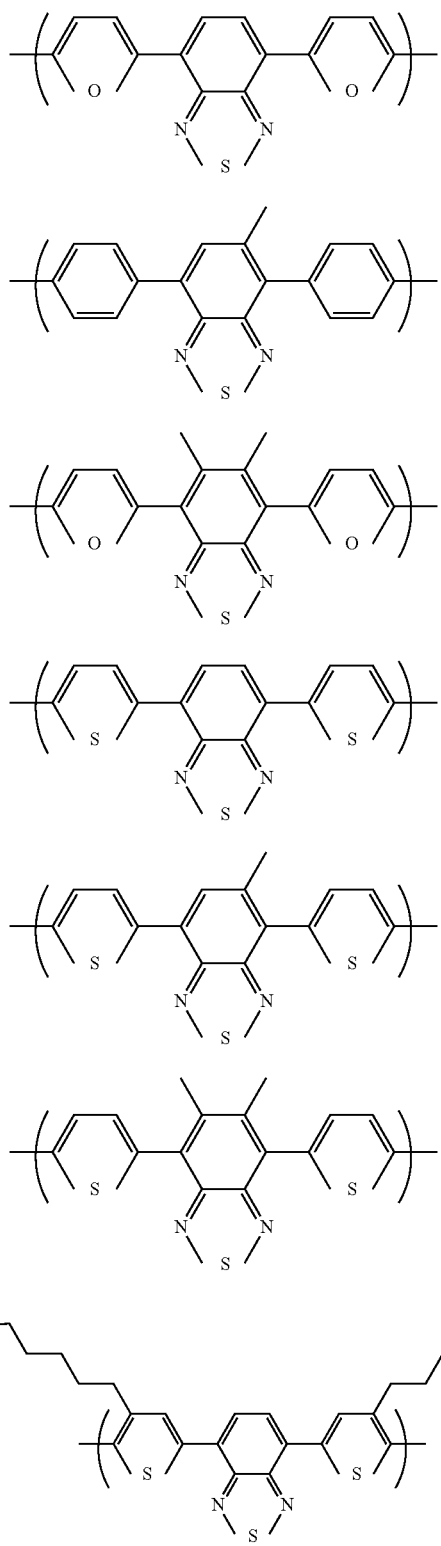

Electroluminescent copolymers may comprise an electroluminescent region and at least one of a hole transporting region and an electron transporting region as disclosed in, for example, WO 00/55927 and U.S. Pat. No. 6,353,083. If only one of a hole transporting region and electron transporting region is provided then the electroluminescent region may also provide the other of hole transport and electron transport functionality.

The different regions within such a polymer may be provided along the polymer backbone, as per U.S. Pat. No. 6,353,083, or as groups pendant from the polymer backbone as per WO 01/62869.

If the light-emissive polymer is cross-linked to provide a cross-linked matrix in which the charge transporting polymer is disposed, then the light-emissive polymers must be functionalised with a suitable cross-linking group such as BCB or a vinyl group.

If the charge transporting polymer is cross-linked to provide a cross-linked matrix in which the light-emissive polymer is disposed, then the charge transporting polymers must be functionalised with a suitable cross-linking group such as BCB or a vinyl group.

If both the charge transporting polymer and the light-emissive polymer are cross-linked providing a first cross-linked matrix and a second cross-linked matrix, whereby the first cross-linked matrix and the second cross-linked matrix provide an interpenetrating network, then both the charge transporting polymer and the light-emissive polymer must be functionalised with a suitable cross-linking group such as BOB or a vinyl group.

Hosts for Phosphorescent Emitters

Embodiments of the present invention may provide a cross-linked charge transporting polymer matrix as a host in which an emissive polymer is disposed. The emissive polymer may comprise a phosphorescent moiety.

Numerous hosts are described in the prior art including homopolymers such as poly(vinyl carbazole) disclosed in, for example, Appl. Phys. Lett. 2000, 77(15), 2280; polyfluorenes in Synth. Met. 2001, 116, 379, Phys. Rev. B 2001, 63, 235206 and Appl. Phys. Lett. 2003, 82(7), 1006; poly[4-(N-4-vinyl-benzyloxyethyl, N-methylamino)-N-(2,5-di-tert-butylphenylnapthalimide] in Adv. Mater. 1999, 11(4), 285; and poly (para-phenylenes) in J. Mater. Chem. 2003, 13, 50-55. Copolymers are also known as hosts.

The aforementioned polymer host materials may be functionalised with a cross-linkable group in order to provide a cross-linked charge transporting polymer matrix as a host material in which an emissive polymer is disposed.

Metal Complexes (Mostly Phosphorescent but Includes Fluorescent at the End)

Preferred metal complexes comprise optionally substituted complexes of formula (V):

$$ML^1_q L^2_r L^3_s \qquad (V)$$

wherein M is a metal; each of $L^1$, $L^2$ and $L^3$ is a coordinating group; q is an integer; r and s are each independently 0 or an integer; and the sum of (a. q)+(b. r)+(c.s) is equal to the number of coordination sites available on M, wherein a is the number of coordination sites on $L^1$, b is the number of coordination sites on $L^2$ and c is the number of coordination sites on $L^3$.

Heavy elements M induce strong spin-orbit coupling to allow rapid intersystem crossing and emission from triplet states (phosphorescence). Suitable heavy metals M include:
lanthanide metals such as cerium, samarium, europium, terbium, dysprosium, thulium, erbium and neodymium; and
d-block metals, in particular those in rows 2 and 3 i.e. elements 39 to 48 and 72 to 80, in particular ruthenium, rhodium, palladium, rhenium, osmium, iridium, platinum and gold.

Suitable coordinating groups for the f-block metals include oxygen or nitrogen donor systems such as carboxylic acids, 1,3-diketonates, hydroxy carboxylic acids, Schiff bases including acyl phenols and iminoacyl groups. As is known, luminescent lanthanide metal complexes require sensitizing group(s) which have the triplet excited energy level higher than the first excited state of the metal ion. Emission is from an f-f transition of the metal and so the emission colour is determined by the choice of the metal. The sharp emission is generally narrow, resulting in a pure colour emission useful for display applications.

The d-block metals form organometallic complexes with carbon or nitrogen donors such as porphyrin or bidentate ligands of formula (VI):

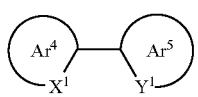

(VI)

wherein $Ar^4$ and $Ar^5$ may be the same or different and are independently selected from optionally substituted aryl or heteroaryl; $X^1$ and $Y^1$ may be the same or different and are independently selected from carbon or nitrogen; and $Ar^4$ and $Ar^5$ may be fused together. Ligands wherein $X^1$ is carbon and $Y^1$ is nitrogen are particularly preferred.

Examples of Bidentate Ligands are Illustrated Below:

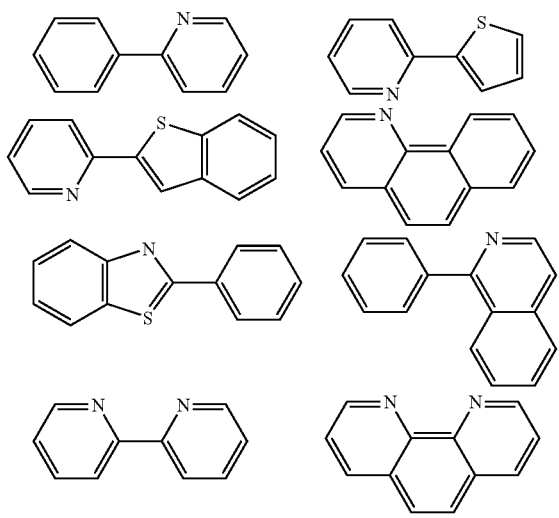

Each of $Ar^4$ and $Ar^5$ may carry one or more substituents. Particularly preferred substituents include fluorine or trifluoromethyl which may be used to blue-shift the emission of the complex as disclosed in WO 02/45466, WO 02/44189, US 2002-117662 and US 2002-182441; alkyl or alkoxy groups as disclosed in JP 2002-324679; carbazole which may be used to assist hole transport to the complex when used as an emissive material as disclosed in WO 02/81448; bromine, chlorine or iodine which can serve to functionalise the ligand for attachment of further groups as disclosed in WO 02/68435 and EP 1245659; and dendrons which may be used to obtain or enhance solution processability of the metal complex as disclosed in WO 02/66552.

Other ligands suitable for use with d-block elements include diketonates, in particular acetylacetonate (acac); triarylphosphines and pyridine, each of which may be substituted.

Main group metal complexes show ligand based, or charge transfer emission. For these complexes, the emission colour is determined by the choice of ligand as well as the metal.

The host material and metal complex may be combined in the form of a physical blend. Alternatively, the metal complex may be chemically bound to the host material. In the case of a polymeric host, the metal complex may be chemically bound as a substituent attached to the polymer backbone, incorporated as a repeat unit in the polymer backbone or provided as an end-group of the polymer as disclosed in, for example, EP 1245659, WO 02/31896, WO 03/18653 and WO 03/22908.

A wide range of fluorescent low molecular weight metal complexes are known and have been demonstrated in organic light emitting devices [see, e.g., Macromol. Sym. 125 (1997) 1-48, U.S. Pat. No. 5,150,006, U.S. Pat. No. 6,083,634 and U.S. Pat. No. 5,432,014], in particular tris-(8-hydroxyquinoline)aluminium. Suitable ligands for di or trivalent metals include: oxinoids, e.g. with oxygen-nitrogen or oxygen-oxygen donating atoms, generally a ring nitrogen atom with a substituent oxygen atom, or a substituent nitrogen atom or oxygen atom with a substituent oxygen atom such as 8-hydroxyquinolate and hydroxyquinoxalinol-10-hydroxybenzo (h) quinolinato (II), benzazoles (III), schiff bases, azoindoles, chromone derivatives, 3-hydroxyflavone, and carboxylic acids such as salicylato amino carboxylates and ester carboxylates. Optional substituents include halogen, alkyl, alkoxy, haloalkyl, cyano, amino, amido, sulfonyl, carbonyl, aryl or heteroaryl on the (hetero) aromatic rings which may modify the emission colour.

Polymerisation Methods

Preferred methods for preparation of polymers are Suzuki polymerisation as described in, for example, WO 00/53656 and Yamamoto polymerisation as described in, for example, T. Yamamoto, "Electrically Conducting And Thermally Stable π-Conjugated Poly(arylene)s Prepared by Organometallic Processes", Progress in Polymer Science 1993, 17, 1153-1205. These polymerisation techniques both operate via a "metal insertion" wherein the metal atom of a metal complex catalyst is inserted between an aryl group and a leaving group of a monomer. In the case of Yamamoto polymerisation, a nickel complex catalyst is used; in the case of Suzuki polymerisation, a palladium complex catalyst is used.

For example, in the synthesis of a linear polymer by Yamamoto polymerisation, a monomer having two reactive halogen groups is used. Similarly, according to the method of Suzuki polymerisation, at least one reactive group is a boron derivative group such as a boronic acid or boronic ester and the other reactive group is a halogen. Preferred halogens are chlorine, bromine and iodine, most preferably bromine.

It will therefore be appreciated that repeat units and end groups comprising aryl groups as illustrated throughout this application may be derived from a monomer carrying a suitable leaving group.

Suzuki polymerisation may be used to prepare regioregular, block and random copolymers. In particular, homopolymers or random copolymers may be prepared when one reactive group is a halogen and the other reactive group is a boron derivative group. Alternatively, block or regioregular, in particular AB, copolymers may be prepared when both reactive groups of a first monomer are boron and both reactive groups of a second monomer are halogen.

As alternatives to halides, other leaving groups capable of participating in metal insertion include groups include tosylate, mesylate and triflate.

Solution Processing

A single polymer or a plurality of polymers may be deposited from solution to form layer 5. Suitable solvents for polyarylenes, in particular polyfluorenes, include mono- or poly-alkylbenzenes such as toluene and xylene. Particularly preferred solution deposition techniques are spin-coating and inkjet printing.

Spin-coating is particularly suitable for devices wherein patterning of the electroluminescent material is unnecessary—for example for lighting applications or simple monochrome segmented displays.

Inkjet printing is particularly suitable for high information content displays, in particular full colour displays. Inkjet printing of OLEDs is described in, for example, EP 0880303.

Cross-Linking

Cross-linking may be achieved by any suitable method, e.g. thermal treatment or exposure to UV, IR or microwave radiation. Thermal treatment represents a simple, low-cost method for achieving cross-linking. However, in some cases it may be desirable to avoid thermal treatment in order to avoid damage to sensitive layers of the device. Moreover, irradiation methods may also allow for faster crosslinking, and therefore a faster overall manufacturing time. The polymers of the present invention may be dissolved in a common solvent, deposited, and then cross-linked to form an interpenetrating or semi-interpenetrating network. If an interpenetrating network is to be provided, the cross-linking groups on one of the polymers should be selectively cross-linkable relative to the cross-linking groups on the other of the polymers. For example, the cross-linking groups on the light-emissive polymer may be cross-linkable at a different temperature to those on the charge transport polymer. Alternatively, the cross-linking groups on one of the polymers may be thermally cross-linkable and the cross-linking groups on the other polymer may by UV cross-linkable. Alternatively still, the cross-linking groups on the polymers may be chemically different such that they preferentially cross-link with polymers having like cross-linking groups thereon.

In order to form a graded interface, one of the polymers may be deposited in a solvent and then the other of the polymers deposited thereover in the same solvent. Intermixing at the interface may be left to occur for a predetermined time and then one or both of the polymers may be cross-linked to "freeze" the morphology at the interface thus forming a stable graded interface.

For example, a hole transport polymer could be deposited and then a light emissive material deposited thereover comprising a polymer host with a phosphorescent moiety disposed therein. Intermixing at the interface may be left to occur for a predetermined time and then one or both of the hole transport polymer and the host polymer may be cross-linked to "freeze" the morphology at the interface thus forming a stable graded interface.

As an alternative, if one of the polymers has a higher affinity to an underlying layer, then the polymers may be deposited in a common solvent to form a graded interface. If the polymers are left for a predetermined length of time, the polymer with the higher affinity for the underlying layer will preferentially diffuse towards the underlying layer forming a concentration gradient. One of both of the polymers may then be cross-linked to "freeze" the morphology thus forming a stable graded interface. For example, polymers comprising amine repeat units may show an affinity for an underlying acidic layer such as a hole injection a layer of PEDOT doped with an acid such as PSS. Without wishing to be bound by any theory, this may be due to an acid-base interaction between the acidic hole transport layer and the basic amine. Alternatively, a hole transporting polymer may be provided with polar end-groups and/or substituents such that the hole transporting polymer is attracted to an underlying polar hole injection layer, such as REDOT/PSS. Another factor influencing phase separation may be molecular weight of the polymers. In particular, a low molecular weight polymer may be more mobile, and may therefore segregate from the other polymer (s) to a greater extent than a corresponding higher molecular weight material.

Cathode

Cathode 4 is selected from materials that have a workfunction allowing injection of electrons into the light-emissive layer. Other factors influence the selection of the cathode such as the possibility of adverse interactions between the cathode and the light-emissive material. The cathode may consist of a single material such as a layer of aluminium. Alternatively, it may comprise a plurality of metals, for example a bilayer of calcium and aluminium as disclosed in WO 98/10621, elemental barium disclosed in WO 98/57381, Appl. Phys. Lett. 2002, 81(4), 634 and WO 02/84759 or a thin layer of a metal compound to assist electron injection, for example a fluoride such as lithium fluoride disclosed in WO 00/48258 or barium fluoride, disclosed in Appl. Phys. Lett. 2001, 79(5), 2001, or an oxide such as barium oxide. In order to provide efficient injection of electrons into the device, the cathode preferably has a workfunction of less than 3.5 eV, more preferably less than 3.2 eV, most preferably less than 3 eV.

Encapsulation

Optical devices tend to be sensitive to moisture and oxygen. Accordingly, the substrate preferably has good barrier properties for prevention of ingress of moisture and oxygen into the device. The substrate is commonly glass, however alternative substrates may be used, in particular where flexibility of the device is desirable. For example, the substrate may comprise a plastic as in U.S. Pat. No. 6,268,695 which discloses a substrate of alternating plastic and barrier layers or a laminate of thin glass and plastic as disclosed in EP 0949850.

The device is preferably encapsulated with an encapsulant (not shown) to prevent ingress of moisture and oxygen. Suitable encapsulants include a sheet of glass, films having suitable barrier properties such as alternating stacks of polymer and dielectric as disclosed in, for example, WO 01/81649 or an airtight container as disclosed in, for example, WO 01/19142. A getter material for absorption of any atmospheric moisture and/or oxygen that may permeate through the substrate or encapsulant may be disposed between the substrate and the encapsulant.

Other

In a practical device, at least one of the electrodes is semitransparent in order that light may be absorbed (in the case of a photoresponsive device) or emitted (in the case of an OLED). Where the anode is transparent, it typically comprises indium tin oxide. Examples of transparent cathodes are disclosed in, for example, GB 2348316.

The embodiment of FIG. 1 illustrates a device wherein the device is formed by firstly forming an anode on a substrate followed by deposition of an electroluminescent/light-emissive layer and a cathode, however it will be appreciated that the device of the invention could also be formed by firstly forming a cathode on a substrate followed by deposition of an electroluminescent layer and an anode.

Displays

A monochrome display may be provided by an array of pixels containing the same coloured electroluminescent material. Alternatively, a full colour display may be provided with red, green and blue sub-pixels. By "red electroluminescent material" is meant an organic material that by electroluminescence emits radiation having a wavelength in the range of 600-750 nm, preferably 600-700 nm, more preferably 610-650 nm and most preferably having an emission peak around 650-660 nm. By "green electroluminescent material" is meant an organic material that by electroluminescence emits radiation having a wavelength in the range of 510-580 nm, preferably 510-570 nm. By "blue electroluminescent material" is meant an organic material that by electroluminescence emits radiation having a wavelength in the range of 400-500 nm, more preferably 430-500 nm.

Displays may be of an active matrix or passive matrix type. Details of these types of displays are known to those skilled in the art and will not be described in any more detail here.

Example

In the case of an interpenetrating network, a simple example would be two differently functionalised polymers. Polymer A may be a charge transporting polymer containing, for example, a fluorene type monomer unit, a triaryl amine unit (such as TFB) and a vinyl functionalised monomer unit. Polymer B may be an emissive polymer or a different charge transporting polymer, again, for example, based on fluorene. Some of the monomer units may be functionalised with a BOB unit.

Example structures are shown below:

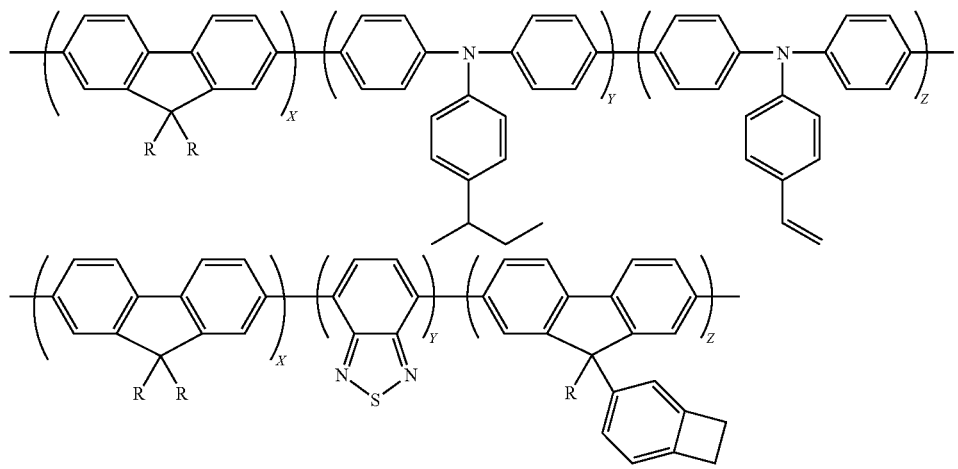

The polymers can be synthesised by Pd catalysed Suzuki coupling in toluene using a organic base:

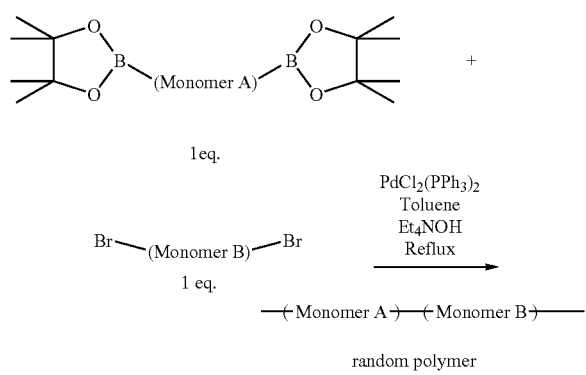

The following monomers can be used for the first hole transporting polymer layer:

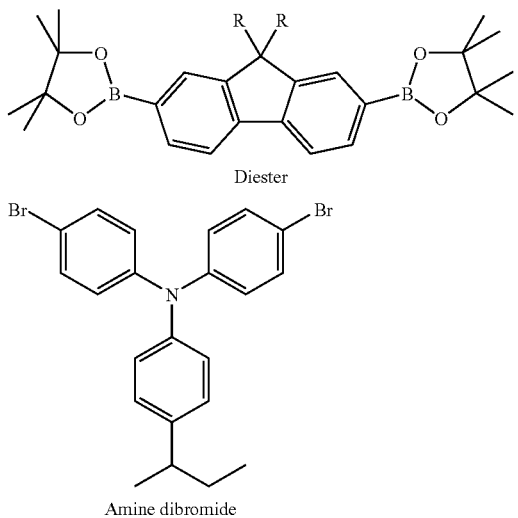

Diester

Amine dibromide

-continued

Xlinker dibromide

R can be alkyl, $C_8H_{17}$.

A typical formulation of this polymer is: X=0.5, Y=0.425, Z=0.075

The second emitting polymer can be made from the following monomers using the same method:

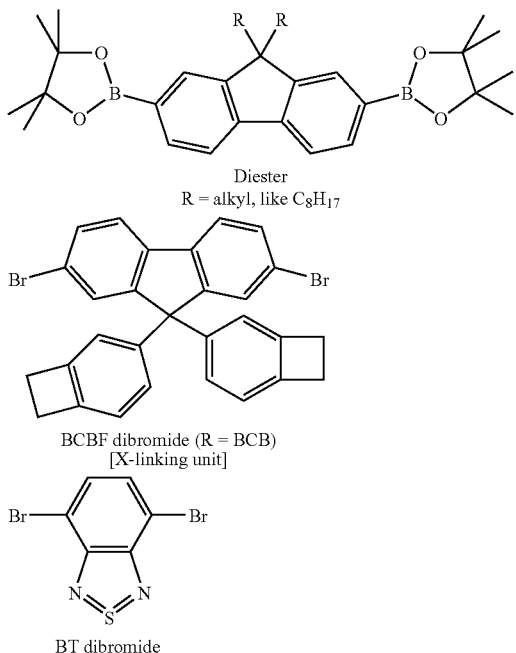

Diester
R = alkyl, like C$_8$H$_{17}$

BCBF dibromide (R = BCB)
[X-linking unit]

BT dibromide

A possible formulation here would be: X=0.5, Y=0.4, Z=0.1

These two materials may be dissolved in a common solvent and then deposited onto a substrate (spin coated or ink jet printed). The organic layer thus formed can then be heated at an appropriate temperature to initiate cross-linking of the vinyl groups (this begins to occur at above 70° C. and is largely complete at 150° C.). The organic layer may then be further heated up to the cross-linking temperature of the other functionality (in this case the BCB unit, ±200° C.). This results in an interpenetrating network (though the BCB units are likely to be less discriminate in their reactivity).

The invention claimed is:

1. An opto-electrical device comprising: a first electrode for injecting charge carriers of a first polarity; a second electrode for injecting charge carriers of a second polarity; and a layer of organic material disposed between the first and second electrodes, the layer of organic material comprising a blend of a first charge transporting and/or light-emissive polymer and a second charge transporting and/or light-emissive polymer, wherein the layer of organic material comprises a first region of the first polymer, a second region of the second polymer, and an interface region disposed between the first and second regions, the interface region comprising the blend, wherein at least the first polymer is cross-linked providing a first cross-linked matrix in which the second polymer is disposed.

2. An opto-electrical device according to claim 1, wherein the second polymer is also cross-linked providing a second cross-linked matrix, whereby the first cross-linked matrix and the second cross-linked matrix provide an interpenetrating network.

3. An opto-electrical device according to claim 1, wherein the second polymer is not cross-linked and is disposed in the first cross-linked matrix providing a semi-interpenetrating network.

4. An opto-electrical device according to claim 1, wherein the concentration of the first and second polymers varies across the layer of organic material in a direction perpendicular to a plane in which the layer of organic material extends.

5. An opto-electrical device according to claim 1, wherein the first polymer is a hole transporting polymer.

6. An opto-electrical device according to claim 1, wherein the second polymer is a light-emissive material and/or an electron transporting polymer.

7. An opto-electrical device according to claim 6, wherein the second polymer is an electron transporting polymer and further comprises a light-emissive moiety disposed therein.

8. An opto-electrical device according to claim 7, wherein the light-emissive moiety is a phosphorescent moiety.

9. An opto-electrical device according to claim 8, wherein the light-emissive moiety is provided as a separate component mixed with the electron transporting polymer or is chemically bound to the electron transporting polymer.

10. An opto-electrical device according to claim 7, wherein the light-emissive moiety is provided as a separate component mixed with the electron transporting polymer or is chemically bound to the electron transporting polymer.

11. An opto-electrical device according to claim 1, wherein the first and second polymers are light-emissive polymers capable of emitting different wavelengths of light which combine to provide a white emissive device.

12. An opto-electrical device according to claim 11, the layer of organic material further comprising a third polymer which is capable of emitting light of a different wavelength to that of the first and second polymers which combines with the light emitted by the first and second polymers to provide the white emissive device.

13. An opto-electrical device according to claim 1, comprising a layer of hole injecting material disposed between the layer of organic material and the first electrode.

14. An opto-electrical device according to claim 1, wherein the first and second polymers are semi-conductive conjugated polymers.

15. A method of manufacturing an opto-electrical device comprising a first electrode for injecting charge carriers of a first polarity; a second electrode for injecting charge carriers of a second polarity; and a layer of organic material disposed between the first and second electrodes, the layer of organic material comprising a blend of a first charge transporting and/or light-emissive polymer and a second charge transporting and/or light-emissive polymer, wherein the layer of organic material comprises a first region of the first polymer, a second region of the second polymer, and an interface region disposed between the first and second regions, the interface region comprising the blend, wherein at least the first polymer is cross-linked providing a first cross-linked matrix in which the second polymer is disposed, the method comprising: depositing, on a substrate comprising the first electrode, a mixture of the first and second polymers in a solvent; cross-linking the first polymer to form a first cross-linked matrix in which the second polymer is disposed; and depositing the second electrode.

16. A method according to claim 15, further comprising cross-linking the second polymer to form a second cross-linked matrix, whereby the first cross-linked matrix and the second cross-linked matrix form an interpenetrating network.

17. A method according to claim 16, comprising cross-linking the first polymer by heating to a first temperature and cross-linking the second polymer by heating to a second temperature which is higher than the first temperature.

18. A method according to claim 15, wherein the first and second polymers partially phase separate after deposition and prior to cross-linking.

19. A method of manufacturing an opto-electrical device comprising a first electrode for injecting charge carriers of a first polarity; a second electrode for injecting charge carriers of a second polarity; and a layer of organic material disposed between the first and second electrodes, the layer of organic material comprising a blend of a first charge transporting and/or light-emissive polymer and a second charge transporting and/or light-emissive polymer, wherein the layer of organic material comprises a first region of the first polymer, a second region of the second polymer, and an interface region disposed between the first and second regions, the interface region comprising the blend, wherein at least the first polymer is cross-linked providing a first cross-linked matrix in which the second polymer is disposed, the method comprising: depositing, on a substrate comprising the first electrode, the first polymer in a first solvent; depositing, over the first polymer material, the second polymer in a second solvent; waiting a period of time to allow the first and second polymer materials to inter-mix at least partially; cross-linking the first and/or the second polymers to form an interpenetrating or semi-interpenetrating network; and depositing the second electrode.

20. A method of manufacturing an opto-electrical device comprising a first electrode for injecting charge carriers of a first polarity; a second electrode for injecting charge carriers of a second polarity; and a layer of organic material disposed between the first and second electrodes, the layer of organic material comprising a blend of a first charge transporting material and a second charge transporting material, wherein the layer of organic material comprises a first region of the first charge transporting material, a second region of the second charge transporting material, and an interface region disposed between the first and second regions, the interface region comprising the blend, wherein at least one of the first and second charge transporting materials comprises a cross-linked polymer, the method comprising: depositing, over a substrate comprising the first electrode, the first charge transporting material, the first charge transporting material being a polymer; partially crosslinking said first polymer; depositing the second charge transporting material over said partially crosslinked first polymer; further crosslinking said first polymer; and depositing the second electrode.

21. An opto-electrical device comprising: a first electrode for injecting charge carriers of a first polarity; a second electrode for injecting charge carriers of a second polarity; and a layer of organic material disposed between the first and second electrodes, the layer of organic material comprising a blend of a first charge transporting material and a second charge transporting material, wherein the layer of organic material comprises a first region of the first charge transporting material, a second region of the second charge transporting material, and an interface region disposed between the first and second regions, the interface region comprising the blend, wherein at least one of the first and second charge transporting materials comprises a cross-linked polymer.

* * * * *